United States Patent [19]

Vaughn

[11] Patent Number: 5,275,861

[45] Date of Patent: *Jan. 4, 1994

[54] RADIATION SHIELDING FABRIC

[75] Inventor: George D. Vaughn, Ballwin, Mo.

[73] Assignee: Monsanto Company, St. Louis, Mo.

[*] Notice: The portion of the term of this patent subsequent to Jan. 21, 2009 has been disclaimed.

[21] Appl. No.: 820,450

[22] Filed: Jan. 9, 1992

Related U.S. Application Data

[63] Continuation of Ser. No. 609,718, Nov. 13, 1990, Pat. No. 5,082,734, which is a continuation-in-part of Ser. No. 454,565, Dec. 21, 1989, abandoned, and a continuation-in-part of Ser. No. 569,882, Aug. 20, 1990, abandoned.

[51] Int. Cl.$^5$ ............................................. B32B 9/00
[52] U.S. Cl. ................................. 428/76; 252/500; 252/511; 252/521; 174/36
[58] Field of Search ............... 252/500, 511, 521; 204/20, 48; 928/76; 117/68

[56] References Cited

U.S. PATENT DOCUMENTS 2,916,398 12/1959 Marvin ................................ 428/336
4,731,500 3/1988 Otsuka ................................ 174/36
5,053,582 10/1991 Terakawa et al. ................... 174/36

FOREIGN PATENT DOCUMENTS 3146235 5/1983 Fed. Rep. of Germany .
3631696 4/1988 Fed. Rep. of Germany .
56-3449 4/1981 Japan .
63-282367 11/1988 Japan .

Primary Examiner—Patrick J. Ryan
Assistant Examiner—Kam F. Lee
Attorney, Agent, or Firm—Thomas E. Kelley; Mark F. Wachter

[57] ABSTRACT

Electromagnetic radiation shielding textile material comprising metal-coated fabric adapted to be applied with overlapping seams at least 4 cm wide to provide at least 80 dB of far-field shielding against electromagnetic radiation between 0.1 and 10 gigahertz. Fabric, e.g. non-woven nylon fabric, coated with at least one layer of electrolessly-deposited metal, e.g. at least 15 g/m$^2$ copper, is useful as backing for wallpaper which can provide effective far-field shielding of electromagnetic radiation.

7 Claims, 2 Drawing Sheets

RADIATION SHIELDING FABRIC

This application is a continuation of Ser. No. 07/609,718, filed Nov. 13, 1990 now U.S. Pat. No. 5,082,734, which is a continuation-in-part of Ser. Nos. 07/454,565 filed Dec. 21, 1989, now abandoned and 07/569,882, now abandoned, filed Aug. 20, 1990.

Disclosed herein are metal coated articles, including metal-coated textile materials, where the metal is electrolessly deposited onto catalyctic films prepared by thermally activating catalytically inert, polymeric films prepared from aqueous solutions of a polymer and a compound of a Group 8 metal. Also disclosed are methods of preparing and using such metal coated articles, catalytic films, catalytically inert films and solutions.

BACKGROUND OF THE INVENTION

Electroless deposition of metal is effected by immersing catalyzed substrates into metal solutions, e.g. of soluble nickel, cobalt or copper, a reducing agent and a chelant. Although substrates can be catalyzed with a variety of metals from Group 1B or Group 8, palladium, despite its cost, is often the catalyst of choice due to its activity. Maintaining adhesion of the catalyst to the surface is of considerable importance since loosely adhered catalytic metal can be washed from the surface in the agitation of the plating bath causing depletion of the metal value of the plating bath as uncontrolled metal deposition occurs, resulting in what is commonly referred to as a "crashed" bath.

Morgan et al. in U.S. Pat. No. 4,910,072 and O'Connor et al. in U.S. Pat. No. 4,900,618 disclose selective catalytic activation of catalytically inert polymeric films comprising complexes of a polymer and a compound of a Group 1B or 8 metal having essentially no metal on the surface. Solutions for preparing such films are prepared with a variety of organic solvents, e.g. tetrahydrofuran, acetone, methyl ethyl ketone, methanol, methyl acetate and ethyl acetate, which are preferably anhydrous. Low levels of water in the organic solvent can be tolerated provided the film is formed in a high humidity environment. Because of environmental concerns with organic vapor emissions, it is becoming more desirable to form films from aqueous solutions rather than from organic solvent solutions.

The use of aqueous coating systems to selectively provide catalytic surfaces has been a long term goal of practitioners in the field of electroless deposition of metals. Lenoble in U.S. Pat. No. 3,615,471 discloses the use of catalytic polymeric photoresistant coatings from aqueous solutions of a polymer such as polyvinyl alcohol (PVOH), a light activated crosslinker such as potassium bichromate and a catalytic metal compound such as palladium dichloride. Such coatings can be used to provide a catalytic pattern on circuit board substrate by exposing the dried coating to U.V. light through a template causing the exposed coating to crosslink; the unexposed water soluble coating is removed by water washing; and the crosslinked coating is cured, i.e. dried by heating at 190° C. for 15 minutes, and electrolessly plated. Polichette et al. in U.S. Pat. Nos. 3,772,056; 3,772,078; 3,925,578; 3,959,547; 3,930,963; and 3,994,727 disclose selective electroless deposition of metal onto films coated from solutions of light or heat reducible metal salt solutions, e.g. containing cupric formate and a light sensitive reducing agent such as anthraquinone 2,6-disulfonic acid disodium salt and a minor amount of surfactant; after exposure to light through a pattern the unexposed coating is washed away with water allowing electroless deposition on the light reduced metal; and Polichette et al. in U.S. Pat. No. 3,779,758 disclose selective electroless deposition of metal onto light cured adhesive films coated from solutions of polymeric adhesive, a catalytic metal salt, e.g. palladium chloride, and a photosensitizer such as a diazonium compound; after exposure to light through a pattern the unexposed coating is washed away allowing electroless deposition on the reduced metal-containing, light-crosslinked adhesive. A disadvantage of using such coatings as disclosed by Lenoble and Polichette et al. is that inadvertent failure to wash away all of the non-crosslinked coating can cause undesired electroless deposition on the substrate or subsequent washing of the coating from agitation in the plating bath can cause the plating bath to crash, i.e. uncontrolled metal reduction and deposition throughout the plating bath.

Miller in U.S. Pat. No. 3,656,952 discloses a photosensitive polymeric, e.g. polyvinylpyrrolidone and polyoxyethylated fatty alcohol, coating containing a photoactive reducing agent, e.g. ferric ammonium oxalate, and a noble metal compound, e.g. complexes of palladium (II) and platinum (IV) with EDTA. On exposure to U.V. or visible light the light sensitive ferric ammonium oxalate causes reduction of the palladium compound. The film is then treated with a reducing agent such as dimethyl boran solution which reduces the palladium in the non-exposed surface. Electroless deposition of nickel results in a non-reversed reproduction of the image, e.g. because light-generated metal nuclei apparently decrease the quality of chemically reduced metal nuclei formed in the light-struck areas resulting in more or faster electroless deposition on the chemically reduced metal nuclei in the areas which were not exposed to light. A disadvantage of such coatings is a lack of good control in selectivity in electroless deposition between areas exposed to light and areas not exposed to light.

Yudelson et al. in U.S. Pat. No. 3,719,490 disclose light sensitive palladium compounds, e.g. potassium palladous chloride, palladium tetramine chloride and potassium palladium oxalate, which on exposure to actinic light form catalytic centers for the electroless deposition of metal; such compounds are applied as coatings from aqueous solutions or from solutions of a polymeric binder such as gelatin or PVOH with a boric acid crosslinker; and, after exposure to actinic light, metal can be electrolessly deposited on the light exposed surface. A disadvantage of using such coatings as disclosed by Yudelson et al. is that only surfaces which can be exposed to light can be provided catalytically active; for instance surfaces on fibers within a bundle which are not readily exposed to direct light cannot be made catalytic.

Rolker et al. in U.S. Pat. No. 3,900,320 discloses processes for metallizing plastic using films of polymer and a catalytic metal compound. In Example 5 Rolker et al. disclose preparing a film using a pre-plate solution of 0.05 parts of palladium chloride and 0.25 parts of polyvinyl alcohol in 100 parts of water; a polyester sheet was dipped in the pre-plate solution and air dried; and when the coated film was then dipped into an electroless nickel plating bath for three minutes, a layer of nickel was deposited. A disadvantage of using such coatings is that selective parts of a substrate can be made catalytic only by selective application of the coating.

Moreover, attempts to duplicate the experimental work of Rolker et al. have been generally unsuccessful. For instance, it has been discovered that when coatings of the Rolker et al. pre-plate solution are air dried at temperatures up to 100° C., the solutions provide catalytically inert films, i.e. the films do not catalyze the electroless deposition of nickel. Only when films are dried at temperatures above the boiling point of water, e.g. at about 150° C., are non-uniform catalytic films formed. Catalytic films formed from aqueous solutions at such high temperatures are undesirable because the films are often poorly formed with wide variations in catalytic activity, apparently because the rapid evolution of solvent causes concentration gradients of catalytic metal across the coating. This is manifest by colored spots on the dried film which comprise high levels of catalytic metal, e.g. about twice the concentration of catalytic metal as present on non-colored portions of the film. A disadvantage of using catalytic metal coatings prepared and dried according to Rolker et al. is the lack of uniform deposition of metal from electroless deposition solutions.

Metal-coated textile materials are useful for a variety of electromagnetic radiation shielding applications, e.g. wall coverings, gaskets, composite housings, protective clothing, and the like from adverse effects of electromagnetic interference. The shielding performance of such metal-coated textile materials is influenced by integrity, adhesion and electrical conductivity of the metal coating, especially the long term conductivity in common environments, e.g. metal-oxidizing environments of high humidity, rain, fog or salt spray.

Metal-coated textile materials prepared by electroless deposition techniques are preferred to textiles coated by other means, e.g. vapor deposition, because line of sight deposition from vapor does not provide uniform metal coating, e.g. at interior surfaces of the textile. Electroless deposition methods are generally more favored because catalytic metal such as palladium can be applied more evenly to fibrous surfaces even interior fibrous surfaces. Nishwitz in U.S. Pat. No. 4,002,779 discloses the metal coating of non-woven fabrics which are made catalytic to electroless deposition by sensitizing with an aqueous hydrochloric acid solution of tin chloride followed by treatment with an aqueous hydrochloric acid solution of palladium chloride. Copper-coated non-woven fabric prepared by such technique is reported to have surface resistivity of 30-80 ohms; and, nickel-coated non-woven fabric, 80-150 ohms.

More conductive metal coated textiles are disclosed by Ebneth in U.S. Pat. No. 4,201,825 where textile materials made catalytic using colloidal palladium are reported as having surface resistivity as low as 4 ohms for copper coatings and 10 ohms for nickel coatings. The environmental durability of the metal coatings was such that after only ten washings of 30 minutes duration in 30° C. emulsifier-containing water, the surface resistivity of nickel-coated fabric degraded from 10 ohms to 300 ohms. In U.S. Pat. No. 4,572,960 Ebneth discloses metallized knitted polyester yarn catalyzed with a solution of butadiene palladium chloride in methylene chloride and plated with nickel having a resistance per square meter of 0.1-0.2 ohms; as indicated above the use of methylene chloride solutions are environmentally undesirable.

SUMMARY OF THE INVENTION

I have discovered that metal coatings having enhanced electrical conductivity and environmental resistance can be electrolessly deposited onto articles coated with a catalytic film prepared by thermally activating a catalytically inert film formed from a an aqueous solution of polymer and a Group 8 metal. Thus, one aspect of this invention provides metal coated articles having uniform surface resistivity of less than 1 ohm. A preferred aspect of this invention is electrolessly-deposited metal coated textiles. Another aspect of this invention provides essentially aqueous solutions of polymer and a water soluble compound of a catalytic metal of Group 8 which can be used to prepare catalytically inert polymeric films which can be selectively activated, e.g. to electroless deposition of metals, by exposure to heat or heat generating radiation. This invention also provides novel, catalytically inert films prepared from aqueous solution of polymer and catalytic metal which can be selectively catalytically activated by heat, e.g. by localized exposure to a heat transfer agent, without the need to employ masking layers or photoreactive additives such as crosslinking and metal reducing agents. Still another aspect of this invention provides catalytically activated films prepared by thermally activating catalytically inert films formed from an aqueous solution of polymer and catalytic metal where such catalytically active films have a uniform distribution of catalytic metal that allows superior catalytic performance, e.g. in catalyzing electroless deposition of strongly adherent metal surfaces.

Yet another aspect of this invention provides processes for preparing catalytically inert, selectively catalytically activatable films from aqueous solutions of water soluble polymers and catalytic metal; methods of selectively catalytically activating such films; and methods of using such films, e.g. for catalyzing the electroless deposition of metal coatings onto such films.

DETAILED DESCRIPTION OF THE INVENTION

Figure 1:
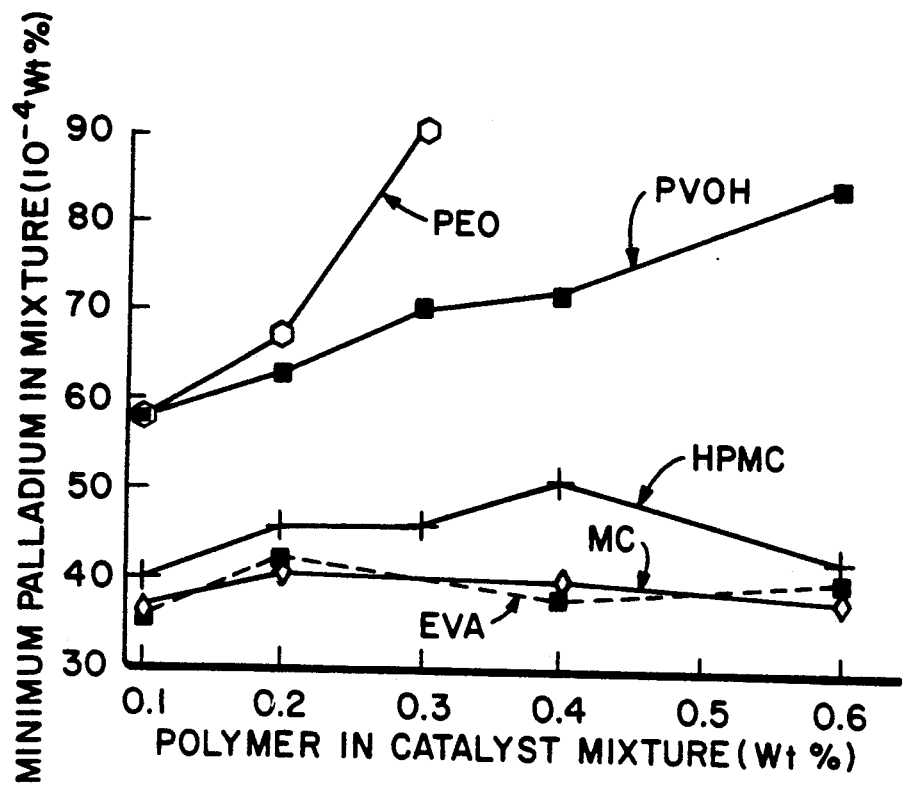
FIG. 1 is a graphical representation of the minimum amount of palladium required in certain catalytically inert films according to this invention.

Throughout this specification, percentages of compositions are by weight and temperatures are in degrees Celsius, unless indicated otherwise.

The term "catalytic metal" as used herein refers to metals of Group 8 of the Periodic Table of Elements, i.e. iron, cobalt, nickel, ruthenium, rhodium, palladium, iridium, osmium and platinum. Preferred Group 8 metals are ruthenium, rhodium, palladium, iridium and platinum. The most preferred metal used in preparing films according to this invention is palladium. Such catalytic metals are desirably employed as water soluble compound, e.g. salts or complexes with ligands such as acetonitrile, acetone, acetate, chloride, nitrate.

The term "complex" as used herein refers to organic ligand-metal combinations where there is molecular interaction, e.g. coordinate bonding, between nucleophilic groups on polymers used in the films of this invention and solubilized catalytic metal compounds.

The term "aqueous solution" as used herein refers to solutions consisting essentially of water and low levels of dissolved catalytic metal and polymer where the polymer is dissolved or dispersed.

The term "Copper Bath" as used herein refers to an agitated electroless plating solution comprising about 8 g/l formalin, about 4 g/l copper, and about 0.12M ethylenediaminetetraacetic acid and which is maintained at pH 11.5–12.5 and about 35° C.

The term "Nickel Bath" as used in the following examples refers to an agitated electroless nickel plating bath (obtained from MacDermid identified as XD7054EN) comprising 6 g/l nickel and 30 g/l sodium hypophosphite monohydrate adjusted to pH 6.5 with ammonium hydroxide solution and maintained at about 60° C.

The term "2 percent caustic/formaldehyde" means an aqueous solution of 2 weight percent sodium hydroxide and 2 weight percent formaldehyde.

The term "catalytically inert" as used herein refers to films of polymer and catalytic metal compounds having surfaces onto which metal is not effectively deposited from standard electroless plating solutions such as a Copper Bath.

The term "catalytically activatable" as used herein refers to catalytically inert films comprising polymer and a compound of a catalytic metal which can be made catalytic, e.g. receptive to effective deposition of metal such as copper or nickel from a standard electroless plating bath, by exposing selected areas of the catalytically inert film to heat or heat generating radiant energy. For instance, heat can be provided to the polymer film by exposing selected areas to heat transfer fluid, e.g. hot air, or coherent electromagnetic radiation such as from a laser, electron beam radiation, etc., which can be adsorbed generating sufficient heat to allow activation. As illustrated in the examples herein the catalytically inert films of this invention, unlike films of the prior art, have not been found to be activatable by exposure to U.V. radiation which does not substantially heat the film.

A useful indication of electrical conductivity of metal-coated articles, e.g. metal coated textile materials is "surface resistivity" which can be measured according to ASTM Standard Test method D-4496 or DIN No. 54345. It is common practice to report surface resistivity in a variety of units of measure, namely "ohms", "ohms per square" and "ohms per square centimeter", which are understood by practitioners in the art to be interchangeable. In the above description of the prior art and the following description of this invention, the illustrative examples and claims, the unit of measure for surface resistivity is "ohms."

The term "uniform surface resistivity" as used herein means that at least nine or ten random measurements of surface resistivity will be below the specified value, e.g. 1 ohm. "Uniform surface resistivity" does not mean average of values both greater than and less than the specified value.

The term "weathering" as used herein means subjecting metal coated articles to continuous exposure to ultraviolet light from xenon lamps and intermittent water spray, i.e. 18 minutes durations of water spray every two hours, under conditions specified in ASTM Standard Practice G-26, e.g. a black body temperature of 63° C.

The metal coated articles of this invention comprise a layer of electrolessly deposited metal on a catalytic layer of polymer and Group 8 metal. Such articles can comprise molded articles where the metal layer provides shielding against electromagnetic radiation, e.g. for electronic equipment housings, or environmental resistance, e.g. for automotive trim or fixtures. Other articles can comprise printed circuits on rigid polymeric substrates or on flexible polymeric films. An especially preferred aspect of this invention provides metal coated textile materials, e.g. woven, non-woven, knitted or needle-punched fabrics, threads, yarns, chopped fiber silver or monofilament tow and the like. The substrate of the metal coated articles can comprise any of a variety of materials including inorganic materials such as metals, metal oxides, stone, ceramics, glass, quartz, alumina, carbon and graphite; organic polymers including organic thermoset polymers such as epoxy and phenolic resins and thermoplastic polymers such as polyamides, polyaramides, polyesters, polyolefins, polycarbonates, polysulfones, styrenics, and cellulosics; and natural materials such as wood. In the case of textile materials the substrate can comprise natural fibers such as cellulosics, synthetic fibers of acrylic, nylon, polyester, polyaramide, inorganic fibers such as glass, quartz, graphite and the like.

Metal coatings on the articles of this invention can comprise any of a variety of the metals which can be deposited electrolessly from aqueous solutions onto palladium catalyzed surfaces, e.g. copper, nickel, cobalt, silver, palladium, platinum, etc. In many cases it is desirable to provide the metal-coated textiles of this invention with a multilayered metal coating, e.g. a first electrolessly deposited layer of copper or nickel and one or more subsequent layers applied electrolessly, electrolytically or by replacement, e.g. in the case of silver. Depending on the application the subsequent layer can comprise copper, nickel, zinc, cobalt, gold, silver, zinc, platinum, palladium, iridium, etc.

The metal coated articles of this invention have an electrolessly deposited metal layer which exhibits enhanced electrical conductivity. For instance the metal coated articles can exhibit uniform surface resistivity of less than about 1 ohm, preferably metal coated textile materials of this invention exhibit a surface resistivity of about 0.1 ohm or less. An especially advantageous property of the metal coated articles of this invention is the ability to withstand weathering without substantial degradation of electrical conductivity. To illustrate the superior environmental resistance of the metal coatings of the this invention, it has been discovered that, even when exposed to 300 hours of weathering according to ASTM Standard Practice G-26, metal coated textiles of this invention have typically exhibited uniform surface resistivity of not more than 15 ohms, e.g. not more than 3 ohms. In preferred embodiments of this invention metal coated textiles exhibit uniform surface resistivity of less than 1 ohm after 300 hours of such weathering.

An even more surprising discovery is that copper electrolessly deposited on films according to this invention can be oxidation resistant and exhibit ductility more than double the heretofore reported ductility of electrolessly deposited copper. Thus, another aspect of this invention is unique electrolessly deposited metals, e.g. copper having substantially the ductility of electrolytic copper. Thus this invention also provides copper coated articles having a coating of electrolessly deposited copper which exhibits unexpectedly high ductility, e.g. greater than 8 percent, even when the copper is deposited on a nonmetallic substrate. In preferred aspects of this invention the electrolessly deposited copper exhibits ductility greater than 10 percent or higher, say at least 12 percent or even up to 16 percent.

The metal-coated textile materials of this invention are especially useful in electromagnetic radiation shielding applications. For instance, copper-coated nylon non-woven fabric according to this invention exhibited greater than 60 dB attenuation in near field shielding of radiation between 100 and 800 megahertz. Metal-coated nylon non-woven fabric according to this invention comprising a first layer of copper and a second layer of tin exhibited far field shielding effectiveness of greater than 60 dB for radiation up to 10 gigahertz.

The metal coated articles of this invention are prepared by electrolessly depositing metal onto a catalytic layer of polymer prepared from aqueous solutions of polymer, e.g. water soluble polymer or emulsions of water insoluble polymer, and catalytic metal of Group 8. Prior art solutions of water soluble polymer and Group 8 metal contain sufficiently high levels of catalytic metal that films dried at room temperature catalyze the electroless deposition of poorly adhering metal films that are readily oxidized. The aqueous solutions of this invention are distinguished from prior art solutions in that the amount of catalytic metal is sufficiently low that films prepared by drying wet films of such solutions at room temperature are catalytically inert, that is such room temperature dried films do not catalyze electroless deposition, e.g. of copper. This is surprising in view of my discovery that, even when catalytically inert, uniformly dispersed catalytic metal is detectible by ESCA (as defined herein) on the surface of such catalytically inert film. I have also discovered that, when wet films of such aqueous solutions are dried at low temperatures, preferably at temperatures less than the boiling point of water in wet films, there is provided catalytically inert films having a surface on which the concentration of such uniformly dispersed catalytic metal at the surface of said film, as measured by ESCA, can vary less than 50 percent from the average concentration of catalytic metal at the surface. I have further discovered that, when catalytically activated by thermal means, such films can catalyze the electroless deposition of metals and essentially no metal oxide providing electrolessly deposited coatings of surprisingly advantageous properties, e.g. exceptional adhesion.

Polymers that are useful in providing the catalytically inert, catalytically activatable films of this invention comprise water soluble polymers and suspensions, e.g. emulsions, of water insoluble polymers. Preferred polymers have weak nucleophilic groups which can coordinately bond to catalytic metal. Such nucleophilic groups include hydroxyl groups, carboxyl groups, carboxylic acid groups, and the like. It has been discovered that certain water soluble polymers have sufficiently strong nucleophilic groups as to be inoperative in this invention. For instance, polyethyleneimine and gelatin have nucleophilic groups that appear to complex with catalytic metal to form catalytically inert films that are not catalytically activatable according to this invention. Thus, a characteristic of the water soluble polymers useful in this invention is the presence of nucleophilic groups that form weaker coordinate bonds with catalytic metal than coordinate bonds between palladium and polyethyleneimine.

Useful water soluble polymers having nucleophilic groups include certain cellulosic polymers, certain vinyl polymers, certain polyoxyolefins and certain inorganic polymers. Among the preferred cellulosic polymers are methylcellulose and substituted methylcellulose polymers, e.g. hydroxypropyl methylcellulose. Among the preferred vinyl polymers are polyvinyl alcohol and esters thereof such as partially hydrolized polyvinyl acetate, polyvinyl pyrolidone, polyvinyl methyl ether, poly acrylic acid and derivatives thereof such as poly methacrylic acid or polyacrylamide, and polyvinyl acetals such as polyvinyl formal and polyvinyl butyral. Among the preferred polyoxyolefins are polyoxyethylene (where low molecular weight polymers, e.g. up to about 10,000 Daltons, are commonly referred to as polyethylene glycol and high molecular weight polymers, e.g. about 100,000–5,000,000 Daltons, are commonly referred to as polyethylene oxide) and polyoxypropylene including oligomers thereof having at least one nonionic end group, e.g. an alkyl or alkaryl end group, which are commonly referred to as surfactants. Preferred inorganic polymers include polysilicas, e.g. suspensions of colloidal silica are useful in preparing metal coated articles of this invention that will can operate at higher temperatures than when an organic polymer is used. Among the more preferred water soluble polymers are polyvinyl alcohol, polyoxyethylene and hydroxypropyl methylcellulose. Oligomeric polyoxyolefins are useful when mixed with other polymers, including water soluble polymers, in forming films that will wet substrates. Thus, many preferred film forming solutions comprise a mixture of water soluble polymers, e.g. polyvinyl alcohol and polyoxyethylene or hydroxypropyl methycellulose and polyoxyethylene.

Water insoluble polymers can be used in the aqueous solutions of this invention when dispersed in the aqueous solution with a surfactant, e.g. a cationic, anionic or neutral charged molecule, oligomer or polymer. Preferred surfactants which are compatible with many water insoluble polymers are neutral polymeric surfactants such as polyoxyethylenes. Thus, aqueous solutions of this invention also include suspensions of a water soluble polymer, e.g. a polyoxyolefin surfactant, and colloidal particles of a thermoplastic polymer capable of forming a coherent film when formed from water emulsions of said polymer, e.g. at a temperature of less than about 200° C. Preferred water insoluble polymers include ionomers such as polyester ionomers having sulfonimide groups and polymers such as polyolefins and polystyrenics.

In many cases it has been found that the dry, catalytically activated films of this invention are stable against solubilization, e.g. when immersed in agitated, aqueous electroless deposition solutions. For instance, metal is sufficiently rapidly deposited on the film to preclude solubilization of the film. In certain other cases, e.g. where only selective areas of water soluble film are activated causing non-selective areas to be exposed to long immersion in agitated aqueous solutions, it may be desirable to incorporate crosslinking agents in the film forming solutions to minimize any tendency for non-selectively activated areas of the film to solubilize and be washed away. Terephthaldicarboxaldehyde, glutaraldehyde or dialdehyde starch are useful for crosslinking hydroxyl containing polymers such as polyvinyl alcohol and cellulosic polymers. In other cases, e.g.

when cellulosic polymers are employed, a basic solubilizing agent, e.g. ammonia, other amine or inorganic hydroxide, is commonly used to facilitate solubilization of the cellulosic polymer. When ammonia is used as a cellulosic solubilizing agent, the ammonia can be effectively liberated in providing a dry film that does not tend to dissolve when immersed in aqueous reducing or metal deposition solutions.

The films of this invention are formed from aqueous solutions of the above described polymers and a water soluble compound of catalytic metal. Useful solutions comprise as little as 0.1 weight percent polymer. Lesser or greater amounts of polymer can be used depending on the film forming character of the polymer and the desired thickness of the film. Especially useful film forming solutions can contain up to about 1 weight percent polymer, e.g. 0.2 or 0.4 weight percent polymer. The upper limit on polymer concentration is limited by the viscosity of the solution. Since useful thin films can be prepared from solutions having generally low concentrations of polymer, it is often desirable, e.g. to promote adhesion and conserve catalytic metal, to consider solutions having less than about 5 weight percent polymer as a practical upper limit for practicing this invention. Preferably solutions will contain less than 3, and more preferably less than 2, weight percent polymer.

Because of the low level of polymer the solutions of this invention generally exhibit low viscosity, e.g. less than about 50 centipoises (as measured at room temperature with a Brookfield No. 1 spindle at 100 rpm), say about 20 centipoises or lower. In cases where it is desired to apply the films of this invention in fine patterns, e.g. onto vertical surfaces of by rotogravure or intaglio printing techniques, it is useful to employ more viscous solutions, e.g. about 50 centipoises or higher. For instance, solutions containing about 0.6 weight percent HPMC have exhibited viscosity of about 100 centipoises.

The catalytically inert films of this invention are provided by employing a higher proportion by weight of polymer than catalytic metal, e.g. in a weight ratio of polymer to catalytic metal of at least 3:1, say about 6:1 or even about 9:1, or even higher. In some cases it may be desirable to provide a film in a weight ratio of polymer to catalytic metal of at least 15:1 or 20:1, even up to 30:1 or more.

Although the solutions of polymer and catalytic metal are essentially aqueous solutions, in some cases it may be useful or desirable to incorporate low levels of one or more low boiling, water-miscible compounds such as ammonia or organic solvent, e.g. acetonitrile or acetone, which as Group 8 metal coordinating ligands facilitate solubility of the catalytic metal compound; such organic solvents tend to be liberated from the film during thermal activation. Since aqueous solutions of many Group 8 metals tend to be unstable, it is often advantageous to utilize volatile stabilizer such as a primary, secondary or tertiary amine, e.g. triethylamine, especially in solutions to be utilized over extended periods of time. Solutions can also comprise noncatalytic compounds, that provide Group 8 metal coordinating ligands, e.g. alkali metal salts of acetate, chloride, nitrate, or other anionic ligands. From observation of experimental results it is believed that such noncatalytic metal compounds can be useful to effect electroless deposition using lower palladium concentrations especially at lower concentrations of certain water soluble polymer, e.g. polyvinyl alcohol. It has also been observed that the use of such noncatalytic compounds promote better adhesion of electrolessly deposited metal. In this regard it is believed that the presence of such noncatalytic compounds enhance the swelling of the polymeric film in an electroless deposition solution allowing reducing agent such as caustic/formaldehyde to reduce catalytic metal within the polymeric film and further allowing metal ions to diffuse to the reduced catalytic metal thus providing the growth of roots of electrolessly deposited metal within the polymeric film which anchor a strongly adhesive layer of electrolessly deposited metal to the polymeric film. In this regard it has been observed when using transparent polymeric films on transparent substrate films that the film side of electrolessly deposited metal is bright when polymeric films do not contain such noncatalytic compounds and dark when polymeric films do contain such noncatalytic metal compounds. The dark appearance is believed to result from light scatter from an irregularly deposited metal surface at the metal/polymeric film interface e.g. where metal roots have been electrolessly deposited into the polymeric film. Useful noncatalytic compounds include sodium or potassium acetate.

The choice of method for applying the aqueous solution to provide catalytically inert films depends on the nature of the substrate and the metallized layer desired. For instance in the case of textile materials such fibers, yarns, woven and nonwoven fabrics, catalytically inert films can be provided by dipping the textile substrate into an aqueous solution and letting the solution drip off or passing the textile through rolls to remove excess solution. The water can be evaporated by letting the wet coated substrate stand in air or be facilitated by warm air passing through the textile material. In the case of flexible or rigid films, the aqueous solution can be applied by roller, doctor blade, spray and such to provide large area coverage of a wet film which can be dried to a catalytically inert film by allowing the water to evaporate. Fine patterns can be applied to film substrates by printing techniques, e.g. intaglio, rotogravure or ink jet printing onto a moving web of the substrate. Methods for coating other types of substrates, e.g. foams, elastomers, housings, containers, etc., will be readily apparent to those skilled in the art of coatings. Depending on the composition of the substrate those skilled in the art can readily prepare aqueous solutions with an appropriately polymer that will be sufficiently compatible with the substrate to allow the desired adhesion of the catalytically inert film to the substrate. The following description of preparing catalytically inert films on common substrates, e.g. films and fibers, is not intended as a limitation but an illustration of the ease in which the aqueous solutions of this invention can be applied to unique substrates. The application of this invention to other substrates should be readily apparent.

Moreover, it has been observed that drying is an important step in the practice of this invention regardless of the nature of the substrate. Evaporation can be advantageously facilitated by exposing the wet film to moderate evaporation conditions, e.g. moderate vacuum or moderate warm air flow, either of which provides an environment having a partial pressure of water low enough to expedite evaporation but is desirably not so low as to cause boiling of water from the film surface. In most cases this can be assured by maintaining the forming film at a temperature less than 95° C. In many cases it is desirable that drying is effected at a temperature less than 80° C., say less than about 60° C. In many preferred cases it may be desirable to evaporate water by drying the film at a temperature less than 45° C. or lower, for instance at a temperature less than 30° C., e.g. at room temperature. It has been observed that high rates of evaporation from a tow of thousands of fibers causes the film forming polymer to be carried away from the center of the tow with the evaporating water leaving portions of the tow devoid of a catalytic metal-containing, polymeric coating, thus spreading the diameter of a tow bundle facilitates uniform film formation.

It has been observed that catalytically inert films prepared by drying film-forming solutions at such moderate temperatures exhibit advantages not found in films formed by drying at temperatures which allow water to boil from the surface. For instance catalytically inert films according to this invention exhibit uniformly dispersed catalytic metal as detectable on the surface by ESCA. On preferred films of this invention the concentration of catalytic metal on the surface, as measured by ESCA, varies less than 50 percent from the average concentration of metal on the surface. Such films are distinguished from films prepared by drying at high temperatures, e.g. above the boiling point of water, which are often not only catalytically inert but also generally exhibit large variations, e.g. 100 percent or more, in the concentration of catalytic metal on the surface. Such large variations in catalytic metal can result in undesirable variation in the catalytic activity to electroless deposition, e.g. high local concentrations of catalytic metal which may be undesirably catalytically active on the otherwise catalytically inert film surface or low local concentrations of catalytic metal which may result in a surface which cannot, at least readily, be activated, e.g. to electroless deposition.

Other advantages exhibited by catalytically inert films prepared by drying films at moderate temperature are manifest after activation of the catalytically inert films, e.g. by heat to catalyze electroless deposition of metal. Catalytically inert films on substrates, e.g. substrate films or a tow of fibers, which comprise water soluble polymer and catalytic metal, can be made catalytic, e.g. receptive to effective deposition of metal such as copper or nickel from a generic electroless plating bath, by exposing the catalytically inert film to heat or heat generating radiation. Such thermal activation can be provided by exposing the catalytically inert film to heated air or by exposing the surface of the film to heat generating radiation, e.g. radiation which can be adsorbed to provide sufficient heat to allow activation. The method of choice for rendering a catalytically inert film catalytically active is often selected by the nature, e.g. shape and composition, of the substrate. For instance, where the substrate is a textile material, e.g. a fabric of tow of fibers, it is generally advantageous to apply heat by forcing heated air through the textile material. Useful heated air temperatures can range from as low as about 100° C. for substrates comprising heat sensitive materials, e.g. polymeric material having a low glass transition temperature, to higher than 200° C. for substrates comprising higher heat resistant material polymeric material having a higher glass transition temperature. While the time of exposure to heated air depends on heat transfer principles, generally activation to a catalytic surface can be effected in shorter times at higher temperature. For instance, exposure to forced air streams heated to about 250° C. for short periods of time, e.g. 5-10 seconds, has been sufficient to activate films to catalyze electroless deposition without adverse effect on a film of water soluble polymer.

An advantage of the films of this invention is that after such thermal activation, e.g. after selective exposure of the surface of said film to a heat transfer agent comprising a fluid at a temperature of 240° C. for up to about 10 seconds, selectively exposed surface of the film will be catalytically active so that copper and essentially no copper (I) oxide will be uniformly electrolessly deposited on said selectively exposed surfaces from an agitated Copper Bath which is maintained at pH 11.5°-12.5° and 35° C. Another surprising advantage of such films according to this invention is that copper so deposited is highly ductile. Heretofore, electrolessly deposited copper has been observed to have ductility of about 3.5 percent. Electrolessly deposited copper on films according to this invention exhibits ductility of at least about 8 percent or higher, say about 12-16 percent which is in the range commonly exhibited by electrolytically deposited copper.

For many applications thermal activation is preferably effected to produce what is believed to be a large number of uniformly-distributed, small clusters of catalytic metal complex, which can be reduced to provide a polymer surface with a large number of uniformly-distributed, small clusters of catalytic metal, e.g. catalytic metal clusters of about 10 Angstrom nominal diameter. In this regard another advantage of the films of this invention is that, after such activation, e.g. selective exposure of the surface of said film to a heat transfer agent comprising a fluid at a temperature of 240° C. for up to about 10 seconds and immersion in a 2 wt percent caustic/formaldehyde solution for about 2 minutes, selectively exposed surface of said film will comprise clusters of reduced catalytic metal wherein more than about 80 percent of the catalytic metal will be present in clusters which are not visible by transmission electron microscopy capable of detecting palladium clusters as small as 14+/−4 Angstroms. In many cases analysis of catalytically active films according to this invention by transmission electron microscopy has failed to detect clusters of catalytic metal leading to a conclusion that the catalytic metal was present in clusters generally smaller than about 10 Angstroms.

The catalytically inert, catalytically activatable films of this invention are advantageously useful in providing articles comprising electrolessly deposited metal on a film formed from an aqueous solution of polymer and a Group 8 metal. The interface of such electrolessly deposited metal and said film is surprisingly essentially devoid of oxide of the electrolessly deposited metal, especially when the electrolessly deposited metal is copper. Because such electrolessly deposited metal is unique, e.g. exhibits surprisingly high ductility, environmental resistance to oxidation and strong adhesion, such articles can exhibit surprising tensile properties over extended periods of time. For instance in the case of articles comprising a substrate, which, when uncoated, exhibits tensile failure at a strain higher than the strain for tensile failure of said electrolessly deposited metal, the electrolessly deposited metal-coated substrate can exhibit tensile failure at a strain less than said strain for tensile failure of said substrate when uncoated, e.g. at about the strain for tensile failure of the electrolessly deposited metal.

Although electrolessly deposited copper on articles according to this invention is exceptionally oxidation resistant, it is often desirable to protect such electrolessly deposited copper from oxidation with a material, e.g. a metal such as nickel, tin, silver, gold or iron or a polymer coating. Certain metal coatings, e.g. nickel, can be applied by electroless or electrolytic deposition; other metal coatings, e.g. tin, can be applied by substitution of the outer layer of copper.

Preferred articles according to this invention comprise textile substrates, e.g. monofilament, yarn or fabric of acrylic, nylon, polyaramide or glass fiber, which is provided with a uniform coating of metal, e.g. copper, nickel, silver, platinum or palladium, about 0.5–5 microns thick. Alternatively, a textile material substrate can be provided with a metal coating, e.g. of the same or different metals, over selective thermally activated intervals along the length of the fibrous substrate. Because of the unique properties imparted to the electrolessly deposited metal, e.g. strong adhesion, and ductility, such metal coated fibrous materials are advantageously processable in conventional textile operations without adverse effect on the mechanical and/or electrical properties of the metal coated article.

The following examples serve to illustrate certain embodiments and aspects of this invention but are not intended to imply any limitation of the scope of the invention.

EXAMPLE 1

This example serves to illustrate the preparation of catalytically inert films of this invention wherein catalytic metal complex is uniformly distributed on the surface of said film such that the concentration of metal on the surface varies less than a 50 percent from the average concentration of metal on the surface.

A solution of water soluble polymer and catalytic metal comprising about 0.05 parts of palladium chloride and about 0.25 parts of polyvinyl alcohol (PVOH) in 100 parts of water was prepared by stirring 300 g of a 1 percent aqueous solution of PVOH (125,000 molecular weight, 88 mole percent hydrolyzed), 0.6 g palladium dichloride and 0.24 g of 37 percent hydrochloric acid in about 900 g of distilled water. Polyethylene terephthalate (PET) film sheets were washed with ethanol to provide a clean surface. The solution of water soluble polymer and catalytic metal was coated onto the PET sheets with a wet film applicator having a 1 mil (25 micron) gap. The solution was dried to a film in air (18 percent relative humidity) at room temperature. Immersion of one of the sheets in a Nickel Bath for about 3 minutes resulted in an absence of electroless deposition of nickel onto the sheet indicating that the film was catalytically inert. After the catalytically inert film was heated for 10 minutes in a 150° C. convective oven and then immersed in a Nickel Bath, the previously catalytically inert film became coated with electrolessly deposited nickel in less than 30 seconds, illustrating a method of catalytically activating a catalytically inert film according to this invention.

One of the sheets having a catalytically activated film was analyzed by Electron Spectroscopy for Chemical Analysis (ESCA) a technique involving irradiating the surface with X-rays and measuring the kinetic energy of the emitted electrons which have not undergone any inelastic event as generally described by Siegbahn et al. in "Electron Spectroscopy for Chemical Analysis", Technical Report AFML-TR-68-189, NTIS: U.S. Dept. of Commerce (1968). ESCA analysis showed that palladium was uniformly distributed on the surface of the film in the range from 0.8 to 1.1 atom percent palladium, i.e. a variation of about 40 percent from the baseline value of 0.8 atom percent. ESCA analysis also indicated that more than 50 percent (typically 66 percent) of the palladium on the surface was reduced palladium, i.e. Pd(0).

Another sheet coated and activated essentially as indicated above in this Example 1 was immersed in a Copper Bath to deposit a bright layer of electrolessly deposited copper. Observation of a transmission electron micrograph (TEM) of the interface of the electrolessly deposited copper and PVOH layer showed a copper layer about 3000 Angstroms thick on the PVOH layer which contains palladium clusters to a depth of about 400 Angstroms. Energy dispersive X-ray analysis (EDS) showed a uniform copper layer with no intermediate layer comprising copper (I) oxide.

COMPARATIVE EXAMPLE 1

A PET sheet was washed and coated with the solution of water soluble polymer and catalytic metal according to the method of Example 1, except the solution was dried for 10 minutes in a convective oven heated to 150° C., resulting in a film with brown spots. ESCA analysis showed that palladium was non-uniformly distributed on the surface of the film ranging from 0.8 to 2.1 atom percent palladium, i.e. a variation of about 160 percent from the baseline value of 0.8 atom percent. ESCA analysis also indicated that less than 50 percent (typically 42 percent) of the palladium on the surface was reduced palladium, i.e. Pd(0). The film as prepared was immersed in a Nickel Bath for less than 30 seconds resulting in electroless deposition of nickel onto the film, indicating that the film as prepared was not catalytically inert.

Another sheet coated essentially as indicated above in this comparative Example 1 was immersed in a Copper Bath to deposit a bright layer of electrolessly deposited copper. Observation of a TEM of the interface of the electrolessly deposited copper and PVOH layer showed an outer copper layer over an intermediate layer on the layer of PVOH which contains palladium clusters. EDS showed that the intermediate layer comprised substantial amounts of copper (I) oxide.

EXAMPLE 2

This example further illustrates methods of using heat to activate catalytically inert films. The procedure of Example 1 for preparing catalytically inert films was repeated except that the solutions were dried to produce films by exposing the wet sheets to air heated to 50° C., 75° C. and 100° C., resulting in catalytically inert films which became catalytically active upon further heating, e.g. for 10 minutes at 150° C.

EXAMPLE 3

This example illustrates the preparation of catalytically inert films on a tow of filaments. A three foot (0.9 meter) long tow of 360,000 filaments of acrylic fiber (2.2 denier) was immersed for 5 minutes in the solution of water soluble polymer and catalytic metal prepared in Example 1. After excess solution was removed by passing the tow through squeeze rollers, the tow was cut into two approximately equal lengths. One length was allowed to dry at room temperature for 24 hours to provide the filaments with a catalytically inert film; the other length was dried as set forth in Comparative Example 3. The tow was then heated in a forced air heated oven at 150° C. for 30 minutes. The heated tow weighed 90 g. The tow was immersed for 2 minutes in a caustic/formaldehyde solution (2 percent sodium hydroxide, 2 percent formaldehyde) to reduce catalytic metal; the wet tow was rinsed in deionized water and dried in a forced air chamber at room temperature. The tow was immersed for 50 minutes in an agitated Nickel Bath; nickel sulfate solution, sodium hypophosphite and ammonium hydroxide were added over the 50 minutes to maintain bath concentrations as plating depleted bath components. The tow was removed from the Nickel Bath, rinsed with water, damp dried by centrifugation and then dried overnight in a 60° C. air oven; the dried tow weighted 113 g, i.e. 23 g of nickel was plated onto the tow.

COMPARATIVE EXAMPLE 3

The other half of the tow coated with the solution of water soluble polymer and catalytic metal in Example 3 was treated to provide a tow coated with a dry film by immediately drying the wet tow for 30 minutes in a 150° C. forced air oven. The dried tow weighed 95 g and was catalytically active. After immersion in the Nickel Bath for 50 minutes and dried, the tow weighed 97 g, i.e. 2 g of nickel was plated onto the tow.

EXAMPLE 4

This example illustrates the utility of a variety of water soluble polymers in preparing the catalytically inert films of this invention. Such polymers include a vinyl polymer, e.g. PVOH; polyoxyolefins, e.g. Triton X-100 polyoxyethylene surfactant from Rohm & Haas (POE-1) and Zonyl FSK polyoxyethylene surfactant from DuPont (POE-2); a polysilica, e.g. Syton X-30 colloidal silica from Monsanto (SYTON); a mixture of a water soluble polymer and an emulsion of a water insoluble polymer at a temperature of less than 200° C. from an aqueous emulsion, e.g. a polyethylene latex emulsion containing a polyoxyethylene surfactant (PE latex); polyethyloxazoline (PEOX), solutions of water soluble polymers which do not form films on the substrate and a polyoxyolefin which allows film formation on the substrate, e.g. a mixture of polyacrylic acid (PAA) and POE-1, a mixture of starch and POE-1 and a mixture of a sugar and POE-1; and a water soluble polymer having strong nucleophilic groups which will not allow the film to be activated, e.g. gelatin. Aqueous solutions were prepared comprising 0.03 percent palladium and 0.25 percent water soluble polymer by mixing the water soluble polymer in a soluble containing 0.063 percent palladium acetate, 7.9 percent acetonitrile and 0.063 percent sodium acetate. Wet films about 25 microns thick solutions were cast onto a PET sheet and dried in room temperature air to provide dry films which were heated in an air oven at 180° C. for 3 minutes, then immersed in a Copper Bath. The quality of any copper deposited is reported in Table 1.

TABLE 1

| polymer | quality of deposited copper |
| --- | --- |
| PVOH | 3 |
| POE-1 | 3 |
| POE-2 | 3 |
| SYTON | 2 |
| PE latex | 2+ |
| PEOX | 1+ |
| starch | film did not form on PET |
| starch and POE-1 | 1+ |
| PAA | film did not form on PET |
| PAA and POE-1 | 3 |
| sugar | film did not form on PET |

TABLE 1-continued

| polymer | quality of deposited copper |
| --- | --- |
| sugar and POE-1 | 2 |
| gelatin | 0 |
| gelatin and POE-1 | 0 |

*3 indicates bright, shiny uniform copper
2 indicates uniform copper with low gloss
1 indicates non-uniform/dark copper
0 indicates no copper

EXAMPLE 5

This example illustrates the minimum amount of catalytic metal required in a catalytically activatable, catalytically inert film can vary depending on the concentration of water soluble polymer in the film forming solution.

Figure 2:
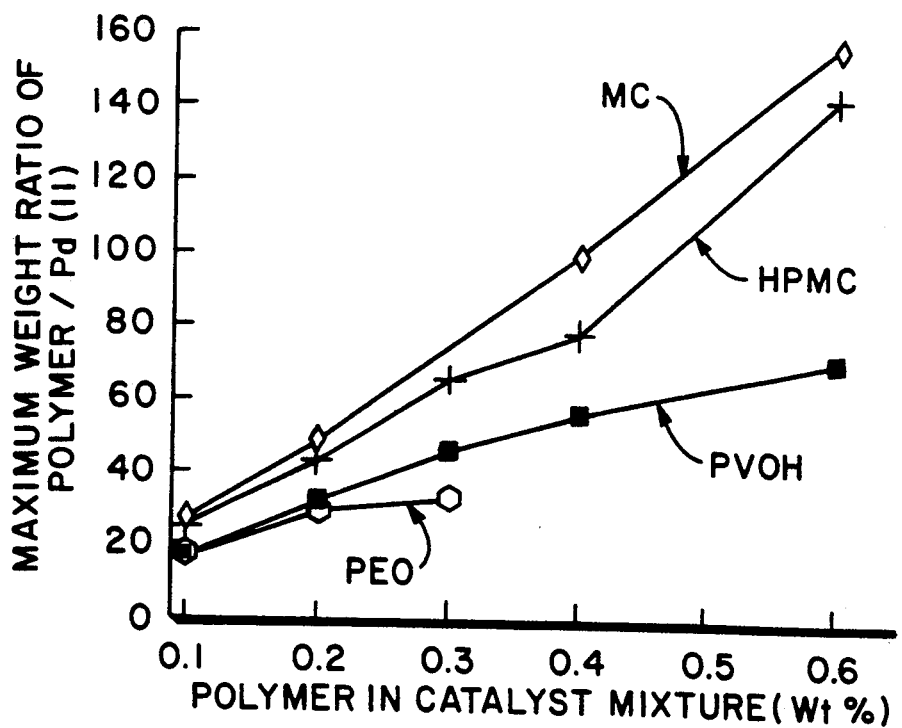
FIG. 2 is a graphical representation of the maximum weight ratio of polymer to palladium in providing certain catalytically inert films of this invention.

Varying amounts of catalytic metal solution containing 0.17 g palladium (II) acetate, 0.185 g sodium acetate, 9 g of water and 7.5 g acetonitrile were mixed with varying amounts of water soluble polymer solution containing 10 g of polyvinyl alcohol solution (1 percent PVOH, 125,000 M. W., 88 mole percent hydrolyzed), 88 g of water and 0.15 g Triton x-100 polyoxyethylene as a surfactant to prepare film forming solutions having 0.1, 0.2, 0.3, 0.4, 0.5 and 0.6 weight percent of PVOH and varying concentrations of palladium. Film forming solutions were cast as 25 micron wet films onto PET sheets; the wet films were dried to catalytically inert films at room temperature, then heat activated at 180° C. for 3 minutes to provide catalytically active films onto which bright copper would deposit from a Copper Bath with generally better adhesion of the metal at lower polymer concentration. The experimental procedure was repeated with each of the following water soluble polymers having weak nucleophilic groups: polyoxyethylene (POE), methylcellulose (MC), hydroxypropyl methylcellulose (HPMC) and ethylene-vinyl acetate polymer (EVA). The results reported in Table 2 A and shown in FIG. 1 were the minimum concentration of palladium in the film forming solution required to provide catalytically inert, catalytically activatable films of the water soluble polymer and palladium acetate as determined by about 50 percent surface coverage by electrolessly deposited copper. The results reported in Table 2 B and shown in FIG. 2, similarly determined, were the maximum weight ratio of water soluble polymer to palladium required to provide catalytically inert, catalytically activatable films of the water soluble polymer and palladium acetate.

TABLE 2 A

Minimum palladium concentration ($\times 10^{-4}$ wt %) for activatable film

| | Wt % polymer in film forming solution | | | | |
| --- | --- | --- | --- | --- | --- |
| Polymer | 0.1 | 0.2 | 0.3 | 0.4 | 0.6 |
| PVOH/POE | 58 | 63 | 70 | 72 | 84 |
| POE | 58 | 67 | 90 | — | — |
| MC/POE | 37 | 41 | — | 40 | 38 |
| HPMC/POE | 40 | 46 | 46 | 51 | 42 |
| EVA/POE | 36 | 42 | — | 38 | 40 |

TABLE 2 B

Maximum weight ratio of polymer/palladium for activatable film

| | Wt % polymer in film forming solution | | | | |
| --- | --- | --- | --- | --- | --- |
| Polymer | 0.1 | 0.2 | 0.3 | 0.4 | 0.6 |
| PVOH/POE | 17 | 32 | 46 | 56 | 71 |

TABLE 2 B-continued

Maximum weight ratio of polymer/palladium for activatable film

| Polymer | Wt % polymer in film forming solution | | | | |
|---|---|---|---|---|---|
| | 0.1 | 0.2 | 0.3 | 0.4 | 0.6 |
| POE | 17 | 30 | 33 | — | — |
| MC/POE | 27 | 49 | — | 100 | 158 |
| HPMC/POE | 25 | 43 | 65 | 78 | 143 |

COMPARATIVE EXAMPLE 5

This example illustrates catalytically active films of the prior art comprising a water soluble polymer and excess palladium such that the films when dried at room temperature are not catalytically inert.

Film forming solutions of 0.1 and 0.2 weight percent PVOH and HPMC with varying amounts of palladium were used to prepare films as in Example 5, except that the films were dried at room temperature and not heated or otherwise activated according to this invention; the dry films were immersed in a Copper Bath to determine the amount of palladium required to provide films that are catalytically active, i.e. not catalytically inert. The results reported in Table 3 indicate a determined threshold for prior art films which were sufficiently active to electrolessly deposit at least 50 percent surface coverage of poorly adhesive, dark copper from a Copper Bath.

TABLE 3

Weight ratio of polymer/palladium for forming catalytically active (not inert) film

| Polymer | Wt % polymer in film forming solution | |
|---|---|---|
| | 0.1 | 0.2 |
| HPMC/POE | 0.95 | 1.67 |
| PVOH/POE | 0.95 | 1.11 |

EXAMPLE 6

This example illustrates the use of alkali metal salts to effect changes in the minimum concentration of palladium required to provide catalytically inert films.

Figure 3:
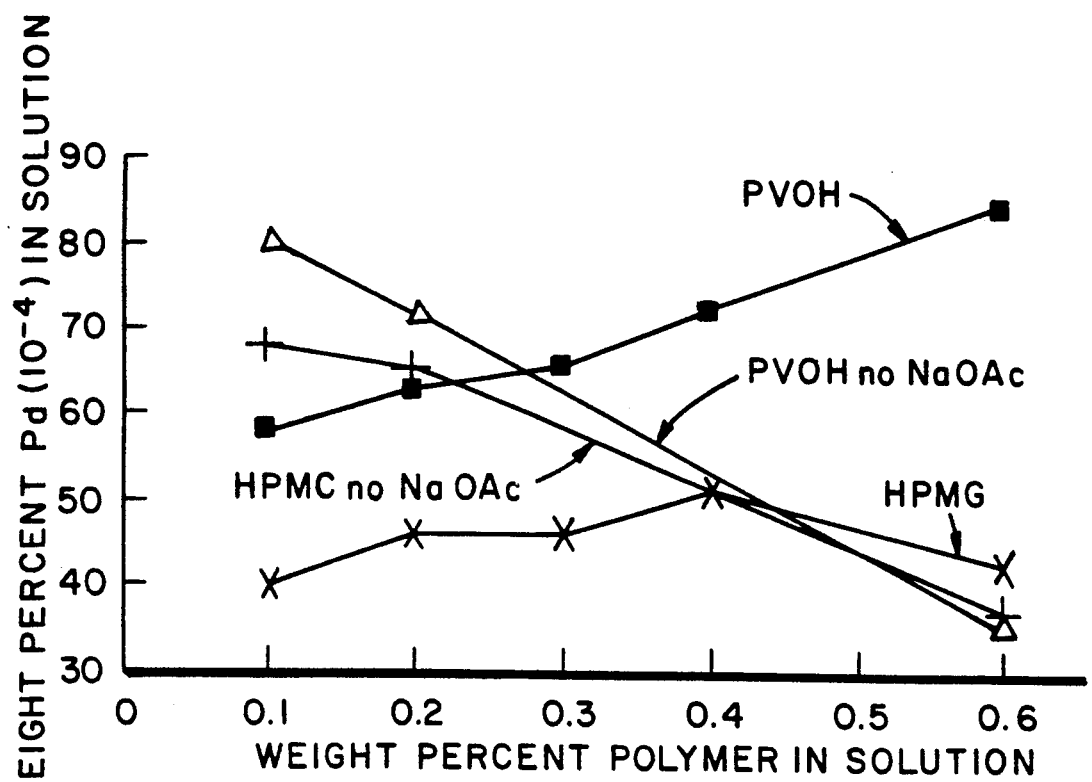
FIG. 3 is a graphical representation of the effect of sodium acetate on the minimum amount of palladium in providing catalytically inert films according to this invention.

Film forming solutions of PVOH and HPMC, palladium acetate both with and without sodium acetate were used to prepare films as in Example 5. The results reported in Table 4 and shown in FIG. 3 indicate the effect of sodium acetate on the minimum amount of palladium required for a catalytically inert, catalytically activatable films according to this invention.

TABLE 4

Minimum palladium concentration ($\times 10^{-4}$ wt %) for activatable film

| Polymer | Wt % polymer in film forming solution | | | | |
|---|---|---|---|---|---|
| | 0.1 | 0.2 | 0.3 | 0.4 | 0.6 |
| HPMC w/NaAc | 40 | 46 | 46 | 51 | 42 |
| HPMC w/o | 68 | 65 | — | — | 36 |
| PVOH w/NaAc | 58 | 63 | 65 | 72 | 84 |
| PVOH w/o | 80 | 72 | — | — | 35 |

EXAMPLE 7

This example illustrates the preparation of catalytically inert films of a cellulosic polymer and catalytic metal which can be activated to provide strongly adhering electrolessly deposited metal on films of PET.

A catalytic metal solution was prepared from 0.08 g palladium (II) acetate, 0.096 g potassium acetate, 2.0 ml water and 10 ml acetonitrile. A water soluble polymer solution was prepared from 0.6 g hydroxypropyl methylcellulose, 0.5 ml triethylamine and about 137 ml water. The catalytic metal solution, followed by 50 ml of rinse water, was mixed with the water soluble polymer solution to provide a film forming solution which was cast as a 25 micron thick wet film onto a PET sheet which was dried in room temperature air to provide a dry film which is catalytically inert to electroless deposition in a Copper Bath and a Nickel Bath. The catalytically inert film was heat activated for 10 minutes in a 160° C. forced air oven to provide a catalytically active film onto which strongly adhering electrolessly deposited copper deposits from a Copper Bath and strongly adhering electrolessly deposited nickel deposits from a Nickel Bath.

EXAMPLE 8

This example illustrates the preparation of catalytically inert films of a vinyl alcohol polymer and catalytic metal which can be activated to provide strongly adhering electrolessly deposited metal on films of PET.

A catalytic metal solution was prepared from 0.0633 g palladium (II) acetate, 0.0633 g sodium acetate, 2.0 ml water and 10 ml acetonitrile. A water soluble polymer solution was prepared from 0.25 g polyvinylalcohol (125,000 M.W., 88 mole percent hydrolyzed) and 0.1 g Triton X-100 polyoxyethylene surfactant and about 38 ml water. The catalytic metal solution, followed by 50 ml of rinse water, was mixed with the water soluble polymer solution to provide a film forming solution which was cast as a 25 micron thick wet film onto a PET sheet which was dried in room temperature air to provide a dry film which is catalytically inert to electroless deposition in a Copper Bath and a Nickel Bath. The catalytically inert film was heat activated for 10 minutes in a 160° C. forced air oven to provide a catalytically active film onto which strongly adhering electrolessly deposited copper deposits from a Copper Bath and strongly adhering electrolessly deposited nickel deposits from a Nickel Bath.

EXAMPLE 9

This example serves to illustrate the selective catalytic activation of catalytically inert films of this invention on a fibrous substrate. This example also illustrates that useful films according to this invention can be prepared using stabilizers such as ammonia without adverse effect on the electroless deposition of metal.

A catalytic metal solution was prepared from 0.1 g palladium (II) acetate, 0.066 g potassium acetate, 2.5 ml water and 10 ml acetonitrile. A water soluble polymer solution was prepared from 0.4 g polyvinyl-alcohol (125,000 M.W., 88 percent mole hydrolyzed) and about 137 ml water. The catalytic metal solution, followed by 50 ml of rinse water and 1 ml of concentrated aqueous ammonia, was mixed with the water soluble polymer solution to provide a film forming solution. A tow of about 2000 glass filaments of about 13 micron diameter (obtained from Owens-Corning and identified as 107B-AD-675-267) was passed through the film forming solution leaving the solution at a vertical rate of about 2 cm/second. The wet tow was dried in a 30° C. air to form a catalytically inert film on the filaments.

The tow was cut into several shorter lengths of catalytically inert polymer coated glass fibers which were selectively heat activated by about 10 seconds exposure to 240° C. air emitting from a 6 mm wide nozzle. One length was immersed in a Copper Bath to selectively electrolessly deposit strongly adhering copper on those sections of the filaments which were exposed to heat activation; another length was immersed in a Nickel Bath to selectively electrolessly deposit strongly adhering nickel on those sections of the filaments which were exposed to heat activation.

COMPARATIVE EXAMPLE 9

This example serves to illustrate the adverse effect on electroless deposition on films prepared according to prior art practices, e.g. Examples 3 and 7 of U.S. Pat. No. 3,719,490.

Following Example 3 of U.S. Pat. No. 3,719,490, a palladium tetraamine chloride solution was prepared by dissolving 0.7 g palladium (II) chloride in a stirred solution of 10 ml concentrated aqueous ammonia and 70 ml distilled water; concentrated hydrochloric acid was added to adjust the solution to pH 6; water was added to provide 193.8 g of a 0.5 percent solution of palladium tetraamine chloride. A piece of paper was dipped into the solution and dried in room temperature air. One side of the paper was exposed for 2 minutes at 1 cm to a 450 watt mercury lamp then immersed in a Nickel Bath. Nickel was electrolessly deposited only on the light exposed side of the paper, indicating that palladium tetraamine chloride is photoactivatable.

Following Example 7 of U.S. Pat. No. 3,719,490 a film forming solution was prepared by combining 10 g of 5 percent aqueous solution of polyvinyl alcohol (2,000 M.W., 75 mole percent hydrolyzed), 10 ml of the 0.5 percent solution of palladium tetraamine chloride and 1 ml of 1 percent solution of boric acid. Wet films (25 microns and 250 microns thick) of the film forming solution were cast onto PET sheets and dried in room temperature air. Films exposed for 15 minutes at about 25 cm to a 450 watt mercury lamp were immersed in a Copper Bath or a Nickel Bath for about 4 minutes; no metal was deposited on any of the films. Films were heated in 160° C. air for 10 minutes and immersed a in Copper Bath or a Nickel Baths for about 4 minutes; blistered (i.e. nonadhering) metal was deposited on the films.

EXAMPLE 10

This example illustrates the preparation of films according to this invention at the same high weight ratio of polymer/palladium, i.e. about 23:1, employed in comparative Example 9.

A catalytic metal solution was prepared from 0.063 g palladium (II) acetate, 0.07 g potassium acetate, 2 ml water and 10 ml acetonitrile. A water soluble polymer solution was prepared from 0.68 g polyvinyl alcohol (2000 M.W., 75 mole percent hydrolyzed) 0.1 g Triton X-100 polyoxyethylene and about 36 g water. The catalytic metal solution, followed by 50 ml rinse water and 0.1 ml triethylamine was mixed with the water soluble polymer solution to provide a film forming solution which was cast as 25 micron thick films onto a sheet of PET and dried in room temperature air. When such films were exposed for 45 seconds or 15 minutes at about 25 cm from a 450 watt mercury lamp and immersed in a Copper Bath or a Nickel Bath, no metal was deposited onto the films. Another such film was heated in 160° C. air for 10 minutes and immersed in a Nickel Bath for about 4 minutes: a strongly adhering (unblistered) layer of nickel was deposited on the film.

EXAMPLE 11

This example illustrates the utility of a variety of Group 8 metals in the practice of this invention.

A catalytic metal solution was prepared from 0.098 g platinum (II) bis(acetonitrile) dichloride, 0.03 g sodium acetate, 2 ml of water and 17.7 ml of acetonitrile. A water soluble polymer solution was prepared from 0.25 g hydroxypropyl methylcellulose, 0.075 g triethylamine and about 38 g water. The catalytic metal solution, followed by 42 ml of rinse water, was mixed with the water soluble polymer solution to provide a film forming solution which was cast as a 25 micron thick wet film onto a PET sheet which was dried in room temperature air to provide a dry film which was catalytically inert to electroless deposition in a Copper Bath and a Nickel Bath. After heat activation for 3 minutes in a forced air oven at 180° C., the film was immersed in a Copper Bath providing bright electrolessly deposited copper on the surface.

Another catalytic metal solution was prepared from 1 g iridium (III) chloride hydrate, 0.64 g sodium acetate, 2 ml of water and 10 ml of acetonitrile. A water soluble polymer solution was prepared from 0.25 g hydroxypropyl methylcellulose, 0.075 g triethylamine and about 25 g water. The catalytic metal solution, followed by 15 ml of rinse water, was mixed with the water soluble polymer solution to provide a film forming solution which was cast as a 25 micron thick wet film onto a PET sheet which was dried in room temperature air to provide a dry film which was catalytically inert to electroless deposition in a Copper Bath and a Nickel Bath. After heat activation for 3 minutes in a forced air oven at 180° C., the film was immersed in a Copper Bath providing bright electrolessly deposited copper on the surface.

EXAMPLE 12

This example illustrates the preparation of a catalytically inert crosslinked polymeric film according to this invention.

A catalytic metal solution was prepared from 0.03 g palladium (II) acetate, 0.02 g potassium acetate, 1.5 ml water, 10 ml acetonitrile and 0.2 g terephthalic aldehyde, a crosslinking agent for cellulosic polymer. A water soluble polymer solution was prepared from 0.3 g hydroxypropyl methylcellulose, 0.09 g triethylamine and about 80 ml water. The catalytic metal solution was mixed with the water soluble polymer solution to provide a film forming solution which was cast as a 25 micron thick wet film onto a PET sheet which was dried in room temperature air to provide a dry, crosslinked cellulosic film which was catalytically inert to electroless deposition in a Copper Bath and a Nickel Bath. The catalytically inert film was catalytically activated by heating for 10 minutes in a 160° C. forced air oven. The catalytically active film was immersed for 90 seconds in a 3 percent sodium hypophosphite solution to reduce the catalytic metal; then immersed for 4 minutes in a 60° C. Nickel Bath resulting in an adherent coating of electrolessly deposited nickel over the entire surface of the film.

COMPARATIVE EXAMPLE 12

The procedure of Example 12 was repeated except that the terephthalic aldehyde was not included in the film forming solution. The catalytically active cellulosic film was half immersed in the hypophosphite catalytic metal reducing solution, then immersed in a Nickel Bath resulting in electrolessly deposited nickel on that part of the film which was not immersed in the hypophosphite solution. Nickel was not electrolessly deposited on that part of the film which was immersed in the hypophosphite solution indicating the tendency of a non-crosslinked water soluble polymer to wash away from a substrate.

EXAMPLE 13

This example illustrates the preparation of a copper coated polymeric fiber using the films of this invention.

A catalytic metal solution was prepared from 1.25 g palladium (II) acetate, 1.25 g sodium acetate, 10 ml water and 50 ml acetone. A water soluble polymer solution was prepared from 2 g polyvinyl alcohol (2,000 M.W., 75 percent hydrolyzed) and about 900 ml water. The catalytic metal solution, followed by 20 ml of rinse water, 2.5 ml triethylamine and 1 ml of Triton X-100 polyoxyethylene surfactant, was mixed with the water soluble polymer solution to provide a film forming solution comprising about 0.2 percent PVOH and about 0.06 percent palladium.

A 1.2 m long tow of about 960,000 acrylic fiber (1 denier per filament) was washed in surfactant water (⅛ ml Triton X-100 polyoxyethylene surfactant/liter), rinsed in water and dried in room temperature air. The tow was immersed in the film forming solution for 5 minutes, passed through a wringer to remove excess solution and hung to dry in room temperature air. The dried tow was activated by exposure to 120° C. air for 30 minutes. The activated tow was immersed in a 2 percent caustic/formaldehyde solution for 2 minutes, then immersed in a Copper Bath for 2.5 hours providing copper coated fiber (56 percent copper). The Copper Bath was replenished with copper, base and formaldehyde periodically over the duration of the immersion.

EXAMPLE 14

This example illustrates the unique properties of metal coatings electrolessly deposited on films according to this invention.

A 2200 filament tow of 2.2 denier acrylic fiber was washed in acidic methanol, immersed in a film forming solution comprising PVOH and palladium, dried at room temperature, and heated at 150° C. and immersed in a caustic/formaldehyde solution to provide acrylic fibers coated with a PVOH film having catalytically active palladium on the surface (Sample 14A). A portion of the tow immersed in a Copper Bath for 20 minutes provided 18 wt percent copper coated fibers (SAMPLE 14B); another portion immersed for 40 minutes provided 30 wt percent copper coated fibers (SAMPLE 14C); and another portion immersed for 60 minutes provided 37 wt percent copper coated fibers (SAMPLE 14D). The results of tensile analysis reported in Table 5 show strong adhesion of an exceptionally ductile copper coating on the acrylic fiber substrate with fiber rupture originating in the copper coating and propagating to the fiber substrate through the metal/substrate interface causing the fiber substrate to fail at a lower elongation than non-coated fiber. Such strong adhesion of electrolessly deposited copper on a non-etched substrate is unexpected in view of the general quality of adhesion commonly observed with metal electrolessly deposited according to prior art practices. The results also show an unexpectedly high ductility of the electrolessly deposited copper, e.g. about 12-16 percent, which is in the range of ductility for electrolytically deposited copper. This is surprising in view of published values of the ductility of electrolessly deposited copper being about 3.5 percent and the ductility of electrolytically deposited copper being about 12.6-16.5 percent; see Nakahara et al., "Microstructure and Ductility of Electroless Copper Deposits", Acta Metall. Vol. 31, No. 5, pp. 713-724 (1983).

TABLE 5

| SAMPLE | WT % Cu | Load at Failure | Elongation at Failure |
|---|---|---|---|
| 14A | 0% | 9.26 g | 18.1% |
| 14B | 18% | 8.04 g | 15.8% |
| 14C | 30% | 7.71 g | 15.3% |
| 14D | 37% | 7.19 g | 12.3% |

To confirm the strong adhesion of the electrolessly deposited copper a confirming tensile analysis was conducted on two 40 mm lengths of electrolessly deposited copper coated acrylic fiber prepared according to this invention (37 and 54 weight percent copper and exhibiting an initial electrical resistance of 11 ohm/cm and 14 ohm/cm, respectively). The fibers were subjected to tensile analysis at 4 mm/min strain rate (10 percent strain/min). The copper coated fibers experienced electrical conductivity failure at 8.4-10.6 percent strain and mechanical failure at 11.6-11.2 percent strain, respectively. This indicated that the electrolessly deposited copper on these fibers exhibited a ductility of about 8.4-10.6 percent.

EXAMPLE 15

This example illustrates the utility of metal coated textile articles according to this invention. Non-woven fabric of nylon, acrylic and graphite fiber, woven nylon ripstop fabric and polyester taffeta fabric were scoured, e.g. with alcohol to remove processing oils, and immersed in an aqueous solution of PVOH and palladium according to this invention. The fabrics were air dried to provide fabrics with catalytically inert films which were thermally activated and immersed in a depleted Copper Bath containing only about 1-2 g/l copper and maintained at room temperature or a depleted Nickel Bath containing only about 2-3 g/l nickel and maintained at 55° C. to provide electrolessly deposited metal coatings of about less than 1 micron, e.g. 0.2-0.7 microns thick. As indicated in Table 6, the metal on certain of the fabrics was overcoated with a second layer of metal, e.g. tin by replacement of copper in a stannous chloride solution promoted by thiourea, nickel and copper by electrolessly deposition and silver by replacement of copper. Certain of the fabrics were tested for environmental resistance of the metal coating by exposure to weathering according to ASTM G26 for between 332 and 450 hours. The surface resistivities reported in Table 6 illustrate the superior electrical properties of the metal coatings of this invention, including the surprisingly high resistance to environmental oxidation especially for copper. The range of resistivities is generally proportional to the relative conductivity of the outer metal layer.

TABLE 6

| Textile | Metal Coating inner/outer | Surface Resistivity initial | weathered |
|---|---|---|---|
| nylon, nonwoven | Cu | 0.04 ohm | 0.29 ohm |
| nylon, nonwoven | Cu/Sn | 0.1 | — |
| nylon, nonwoven | Cu/Ni | 0.23 | — |

TABLE 6-continued

| Textile | Metal Coating inner/outer | Surface Resistivity initial | Surface Resistivity weathered |
|---|---|---|---|
| acrylic, nonwoven | Cu/Ni | 0.3 | 0.7 |
| acrylic, nonwoven | Cu/Sn | 0.3 | 3.1 |
| acrylic, nonwoven | Ni | 1.3 | 15 |
| graphite, nonwoven | Cu/Ni | 0.09 | — |
| nylon, ripstop | Cu | 0.04 | 0.43 |
| nylon, ripstop | Cu/Ni | 0.13 | — |
| nylon, ripstop | Cu/Ag | 0.07 | 0.41 |
| polyester, taffeta | Cu/Ni | 0.04 | — |

The utility of such metal coated textiles in electromagnetic radiation shielding applications, e.g. in equipment housings or on walls as a wallpaper backing, is illustrated in the results of far field shielding testing conducted between 0.1–10 gigahertz in accordance with MIL-STD-285 using a 60×60 cm port. Each sample was prepared by gluing with conventional wallpaper paste three strips of metal coated nylon non-woven fabric resulting in a sample having two overlapping seams (about 4 cm wide). Shielding effectiveness was in proportion to the relative conductivity of the metal coating with copper coated fabric exhibiting shielding of 80–90 dB; tin over copper coating, 70–80 dB; and nickel over copper coating, 60–70 dB. The copper coated fabric comprised about 15 g/m$^2$ copper, exhibited air permeability, high strength, good adhesion, e.g. to a backing such as wallpaper, and about 95 percent of the shielding effectiveness of a foil containing the same amount of metal per unit area; the equivalent metal foil would be 1.7 microns thick which is too fragile to handle, would not adhere well to a backing and would not be permeable to air.

EXAMPLE 16

This example illustrates the invention using an aqueous solution of catalytic metal and a dispersed ionomer. The procedure of the above Example 1 was essentially repeated except that an aqueous solution (1 weight percent polymer) was prepared by mixing a catalytic metal solution (prepared by adding 0.05 g palladium acetate to a mixture of 2 drops of water and 2 ml of acetone) and a polymer solution (prepared by adding 21 g water and 0.05 g of 25 percent Triton X-100 polyoxyethylene to 1.79 g of a 28 weight percent dispersion of Eastman AQ 55D polyester ionomer containing sulfonimide units obtained from Eastman Chemical Company), followed by 25 ml of rinse water. The aqueous solution was coated onto a PET sheet using a 1 mil film applicator, air dried at ambient temperature, thermally activated in an air oven at 160° C. for 10 minutes, then immersed in a diluted Copper Bath for 2 minutes. In a test of copper adhesion using common adhesive tape, the adhesive was pulled of the tape and transferred onto the copper.

EXAMPLE 17

This example illustrates the utility of the solutions of this invention in providing printed metal on substrates. An aqueous solution according to this invention containing 0.28 weight percent HPMC and 0.09 weight percent palladium was prepared by mixing a catalytic metal solution (prepared by adding 14.4 g palladium acetate to a mixture of 120 ml of water and 908 ml of acetone) and a polymer solution (prepared by adding 4732 g water and 8.25 g of 25 percent polyoxyethylene obtained from Texaco as Surfonic N95 to 2240 g of a aqueous solution 1 weight percent of HPMC obtained from Dow as J75MS and 0.3 weight percent of triethanolamine as a solubilizing aid). The aqueous solution was coated onto a gravure roll (engraved with a printed circuit test pattern identified as IPC-A-42) and printed onto a PET film, the coating of aqueous solution was dried to a catalytically inert film which was thermally activated by exposure to 290° C. air for about 12 seconds and then immersed in a depleted Copper Bath containing about 1.5 g/l copper and maintained at about 30° C., resulting in good quality copper printed circuits on the PET sheet.

While specific embodiments have been described, it should be apparent to those skilled in the art that various modifications thereof can be made without departing from the true spirit and scope of the invention. Accordingly, it is intended that the following claims cover all such modifications within the full inventive concept.

What is claimed is:

1. Electromagnetic radiation shielding textile material comprising metal-coated fabric having a uniform coating of an electrolessly deposited metal about 0.5 to 5 micrometers thick wherein, when strips of said fabric are joined with overlapping seams about 4 cm wide, said fabric provides at least 80 dB of far-field shielding against electromagnetic radiation between 0.1 and 10 gigahertz when tested in accordance with MIL-STD-285 using a 60×60 cm port.

2. Electromagnetic radiation shielding textile material according to claim 1 wherein said fabric is non-woven nylon, carbon, acrylic or polyester fabric.

3. Electromagnetic radiation shielding textile material according to claim 2 wherein said metal is nickel, silver or copper.

4. Wallpaper effective for far-field shielding of electromagnetic radiation between 0.1 and 10 gigahertz having as a backing metal-coated non-woven fabric; uniformly coated with at least one layer of electrolessly-deposited metal about 0.5 to 5 micrometers thick; wherein, when strips of said wallpaper joined using wallpaper paste with overlapping seams about 4 cm wide is tested in accordance with MIL-STD-285 using a 60×60 cm port, said wallpaper exhibits at least 80 dB far field shielding against electromagnetic radiation between 0.1 and 10 gigahertz.

5. Wallpaper according to claim 4 wherein said backing comprises non-woven nylon, carbon, acrylic or polyester fabric uniformly coated with at least one layer of copper, nickel or silver.

6. Electromagnetic radiation shielding textile material according to claim 3 wherein said far field shielding is at least 90 dB.

7. Wallpaper according to claim 5 wherein said far field shielding is at least 90 dB.

* * * * *